(12) United States Patent
Hsu et al.

(10) Patent No.: US 6,542,973 B2
(45) Date of Patent: Apr. 1, 2003

(54) INTEGRATED REDUNDANCY ARCHITECTURE SYSTEM FOR AN EMBEDDED DRAM

(75) Inventors: Louis L. Hsu, Fishkill, NY (US); Li-Kong Wang, Montvale, NJ (US); Toshiaki K. Kirihata, Poughkeepsie, NY (US); Gregory J. Fredeman, Staatsburg, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/898,434

(22) Filed: Jul. 3, 2001

(65) Prior Publication Data

US 2003/0009615 A1 Jan. 9, 2003

(51) Int. Cl.[7] .............................................. G06F 12/00
(52) U.S. Cl. ........................................ 711/154; 711/104
(58) Field of Search ................................. 711/104, 154

(56) References Cited

U.S. PATENT DOCUMENTS

| 5,555,212 A | * | 9/1996 | Toshiaki et al. | ............. 365/149 |
| 5,961,653 A | * | 10/1999 | Kalter et al. | ................... 714/30 |
| 6,016,280 A | * | 1/2000 | Maesako et al. | ............. 365/226 |
| 6,426,903 B1 | * | 7/2002 | Clevenger et al. | ........... 365/200 |
| 6,445,626 B1 | * | 9/2002 | Hsu et al. | .................... 365/200 |

* cited by examiner

*Primary Examiner*—Reba I. Elmore
(74) *Attorney, Agent, or Firm*—Dilworth & Barrese, LLP

(57) ABSTRACT

An integrated redundancy eDRAM architecture system for an embedded DRAM macro system having a wide data bandwidth and wide internal bus width is disclosed which provides column and row redundancy for defective columns and rows of the eDRAM macro system. Internally generated column and row addresses of defective columns and rows of each micro-cell block are stored in a memory device, such as a fuse bank, during an eDRAM macro test mode in order for the information to be quickly retrieved during each cycle of eDRAM operation to provide an SRAM-like operation. A column steering circuit steers column redundant elements to replace defective column elements. Redundancy information is either supplied from a SRAM fuse data storage device or from a TAG memory device depending on whether a read or write operation, respectively, is being performed. The integrated redundancy eDRAM architecture system enables data to be sent and received to and from the eDRAM macro system without adding any extra delay to the data flow, thereby protecting data flow pattern integrity.

24 Claims, 4 Drawing Sheets

INTEGRATED REDUNDANCY ARCHITECTURE SYSTEM FOR AN EMBEDDED DRAM

FIELD OF THE INVENTION

This invention relates to the field of integrated circuit (IC) design. Specifically, it relates to an integrated redundancy architecture system for an embedded DRAM (eDRAM) macro system having a wide data bandwidth and wide internal bus width.

BACKGROUND OF THE INVENTION

Embedded DRAMs (eDRAMs) with wide data bandwidth and wide internal bus width have been proposed to be used as L2 (level-2) cache to replace pure SRAM cache. Since each DRAM memory cell is formed by a transistor and a capacitor, the size of DRAM cache is significantly smaller than that of SRAM cache. In order to meet performance requirements, DRAMs are made of a plurality of blocks or micro-cells. A block is a small DRAM array unit formed by a plurality of wordlines (e.g., from 64 to 256) and a plurality of bitline pairs (e.g., from 64 to 256). The size of a block is much smaller (e.g., 16× to 256×) than that of a bank of a conventional stand-alone DRAM. Only one block of the eDRAMs is activated each time. The read and write speed of an eDRAM can be fast due to very light loading of wordlines and bitlines.

In order to effectively utilize the large DRAM cache size, a small SRAM unit about the same size of an eDRAM block is used. The SRAM unit serves as a cache interface between an eDRAM and processor(s). The wide internal bus is used for transferring data among eDRAM, SRAM and the processor(s). More specifically, data residing in eDRAM memory cells coupled to a wordline traversing an eDRAM block is transferred to primary sense amplifiers. The data is then transferred to corresponding secondary sense amplifiers. The data is then transferred to the SRAM and stored in the memory cells thereof at the same wordline location. A TAG memory records the block address of the data stored within the SRAM. The data is then transferred to the processor(s).

Generally, neither column addressing nor column decoding is provided for the wide bandwidth eDRAM configuration, since they are not necessary. Hence, a main challenge of the wide bandwidth eDRAM configuration is to provide an effective column redundancy scheme to repair defective column elements without using column addressing. Most of the conventional DRAM approaches require a column address to indicate the location of failed column elements requiring repair.

In a conventional DRAM array, bitline pairs are grouped hierarchically by column address. Only one data bit from a group of bitlines is selected to be transferred via the local and global datalines each time. Therefore, the most common redundancy approach for the conventional DRAM is to provide repair for whole group of bitlines using the column address.

This approach does not lend itself to a wide bandwidth eDRAM, because data from every pair of bitlines of the eDRAM is simultaneously accessed. Further, since all the datalines are coupled to the eDRAM, the data from every pair of bitlines is simultaneously transferred to SRAM cache; and since all the datalines are coupled to the SRAM, the data from the SRAM is then all simultaneously transferred to the processor(s). For such a one-to-one wiring configuration, if any of the datalines fail and no redundancy is offered, the chip must be discarded.

If, however, redundancy bitlines are provided in the wide bandwidth eDRAM, it is not easy to correctly replace the failed pair of bitlines without affecting the integrity of the data flow pattern. This is because any defective column or row element must be replaced dynamically within each clock cycle with corresponding redundant elements without breaking data flow pattern. Further, the dynamic redundancy replacement process and the redundant elements themselves should not add any extra delay in the critical path of data flow. Due to these requirements, such in-situ redundancy replacement process must be performed in nanosecond speed. Accordingly, an integrated redundancy architecture system is needed which meets the speed requirement of an eDRAM macro without adding too much complexity to the DRAM system.

SUMMARY

An aspect of the present invention is to provide an integrated redundancy architecture system for an embedded DRAM (eDRAM) macro system having a wide data bandwidth and wide internal bus width.

Another aspect of the present invention is to provide an integrated redundancy architecture system for an eDRAM macro system capable of efficiently storing fuse column and row information, in order for the information to be quickly retrieved during each cycle of eDRAM operation to provide an SRAM-like operation.

Further, another aspect of the present invention is to provide an integrated redundancy architecture system which provides redundancy operation to fulfill simultaneous eDRAM read/write operations.

Finally, another aspect of the present invention is to provide an integrated redundancy architecture system for an eDRAM macro system having a minimum amount of redundancy hardware for minimizing the amount of chip area utilized by the system.

Accordingly, an integrated redundancy eDRAM architecture system for an embedded DRAM macro system having a wide data bandwidth and wide internal bus width is disclosed which provides column and row redundancy for defective columns and rows of the eDRAM macro system. Internally generated column and row addresses of defective columns and rows of each micro-cell block are stored in a memory device, such as a fuse bank, during an eDRAM macro test mode in order for the information to be quickly retrieved during each cycle of eDRAM operation to provide an SRAM-like operation. A column steering circuit steers column redundant elements to replace defective column elements. Redundancy information is either supplied from an SRAM fuse data storage device or from a TAG memory device depending on whether a read or write operation, respectively, is being performed. The integrated redundancy eDRAM architecture system enables data to be sent and received to and from the eDRAM macro system without adding any extra delay to the data flow, thereby protecting data flow pattern integrity.

DETAILED DESCRIPTION OF THE INVENTION

The present invention provides an integrated redundancy embedded DRAM (eDRAM) architecture system for an eDRAM macro system having a wide data bandwidth and wide internal bus width. It is contemplated that the column redundancy eDRAM architecture system is provided with a self-diagnostic system for testing column redundancy elements of the architecture system.

Figure 1:
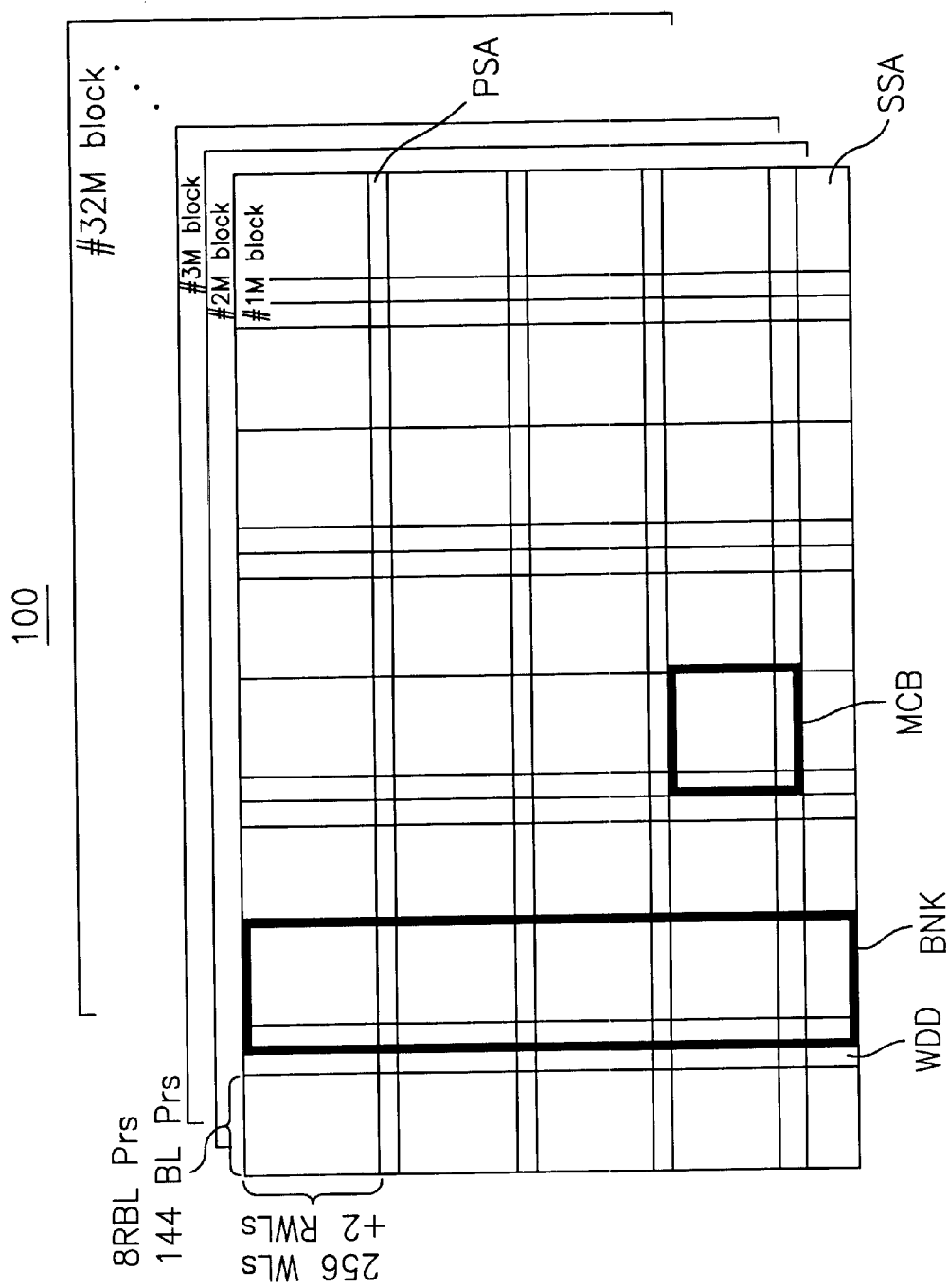
FIG. 1 is a block diagram of a prior art embedded DRAM (eDRAM) macro system having a micro-cell architecture.

With reference to FIG. 1, there is shown a block diagram of an exemplary prior art eDRAM macro system having a micro-cell architecture and designated generally by reference numeral 100. The eDRAM macro system 100 includes a plurality of one mega-byte micro-cell blocks, e.g., micro-cell blocks #1M block, #2M block, #3M block, ..., #32M block. Each mega-byte micro-cell block includes eight banks, e.g., bank BNK. Depending on the application, a typical eDRAM macro may include 64 to 512 banks. Each bank includes four micro-cells, e.g., micro-cell MCB. Each micro-cell includes 258 wordlines, where two wordlines are redundant wordlines RWL, and 152 bitline pairs, where eight bitline pairs are redundant bitline pairs RBL. Wordline decoder/driver circuitry WDD is used to activate the wordlines. A primary sense amplifier block PSA is provided for each micro-cell and a secondary sense amplifier block SSA is provided for each bank.

As known in the art, for random access, a row of data from any micro-cell of any bank of any 1 Mb block in the eDRAM macro system 100 can be accessed for a read and/or write operation. Once the data are retrieved, they are stored in the SRAM cache buffer. During a following cycle, if the same row of data is accessed again, the processor can obtain the data directly from the SRAM cache buffer without accessing the eDRAM macro system 100. This is referred to as a "hit" situation.

The SRAM cache buffer has an identical size as a bank of the eDRAM macro system 100. Accordingly, the data that are stored in the SRAM cache buffer at the same row location as the data retrieved from the eDRAM macro system 100 are retrieved from the SRAM cache buffer during the following cycle, if the same row of data is accessed again. Therefore, in a TAG memory device, information regarding the data that are stored in the SRAM cache buffer is recorded.

Figure 2:
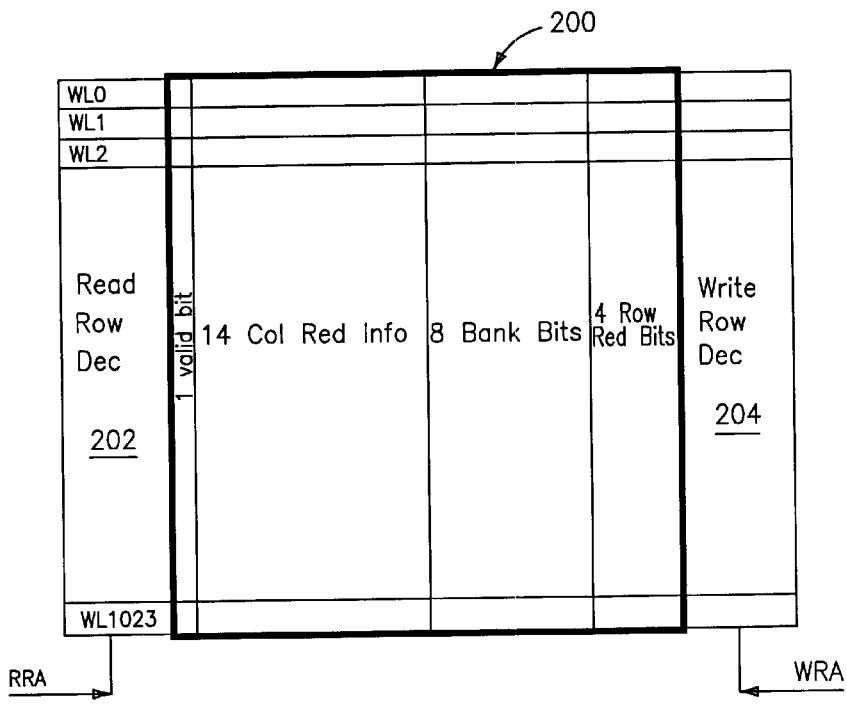
FIG. 2 is a block diagram of an exemplary TAG memory device and adjacent devices of an integrated redundancy eDRAM architecture system according to the present invention.

An exemplary TAG memory device of the integrated redundancy eDRAM architecture system according to the present invention is shown by FIG. 2. The TAG memory device has 1024 wordlines and is designated generally by reference numeral 200. The TAG memory device 200 has the same word dimension as the SRAM cache buffer and a bank of the eDRAM macro system 100.

A dual-port SRAM memory is preferably used for the TAG memory device 200 in order that the TAG memory device 200 is able to perform short-cycle, high-speed caching for read and write operations to maintain an SRAM-like seamless operation. When requested data do not reside in the SRAM cache buffer, or a "miss" situation occurs, a write operation is executed to get rid of the data that are stored in the SRAM cache buffer. The data are "retired" back to the eDRAM macro system 100, while at the same time, the requested data demanded by an incoming address are fetched from the eDRAM macro system 100. Therefore, an eight-bit read row address signal (RRA) and an eight-bit write row address signal (WRA) are simultaneously transmitted to the exemplary TAG memory device 200 for information via a read row decoder 202 and a write row decoder 204, respectively, as shown by FIG. 2.

Inside the exemplary TAG memory device 200, each row contains one "valid" bit, 14 column redundant information bits (14 Col Red Info), eight bank address bits (8 Bank Bits), and four encoded row redundant information bits (4 Row Red Bits).

For a read or write operation, the incoming address containing a row address bit field and block address bit field, or micro-cell block address bit field, is received by an address buffer register. The row address bit field is used to decode the TAG memory device 200 via one of the two row decoders 202, 204. After the row is selected, the valid bit which is stored within the TAG memory device 200 and which corresponds to the selected row is checked.

If the valid bit is high, the SRAM cache buffer of the selected row has been stored with a set of valid data. The valid data are from a block having its micro-cell block address bit field stored within the TAG memory device 200. If the valid bit is low, the SRAM cache buffer of the selected row has not been stored with a set of valid data.

Figure 5:
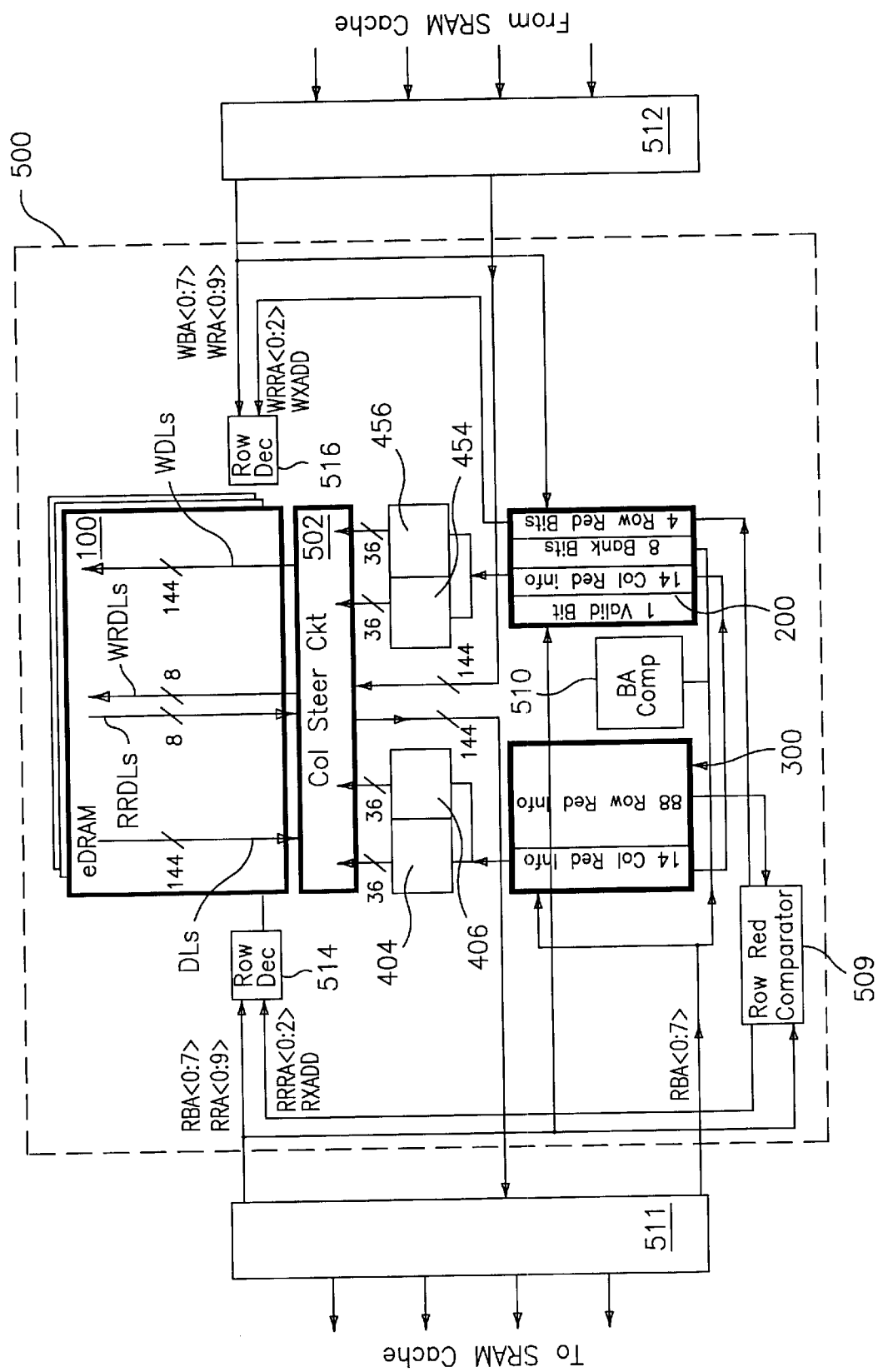
FIG. 5 is a block diagram of the integrated redundancy eDRAM architecture system according to the present invention.

If the valid bit is high, the micro-cell block address bit field of the incoming address is compared with the micro-cell block address bit field stored within the TAG memory device 200 using a bank address comparator circuit 510 (see FIG. 5). If the two block addresses are identical, then a "hit" signal is issued which means data to satisfy a data read request are stored in the SRAM cache buffer. The data are then transferred out to the processor(s) from the SRAM cache buffer and the read operation is over.

If the two addresses do not match, or if the valid bit is low, then a "miss" signal is issued which means data to satisfy the data read request are not stored in the SRAM cache buffer. The data must be retrieved from the eDRAM macro system 100.

Prior to accessing the eDRAM macro system 100, the existing unwanted data in the SRAM cache buffer must be sent back to the eDRAM macro system 100, i.e., retired back to the eDRAM macro system 100. In order to accomplish this task, both column and row redundancy information stored in the TAG memory device 200 must be retrieved from one port of the TAG memory device 200. The column and row redundancy information is then used to located the right location in the eDRAM macro system 100 for data retirement. A new set of TAG memory information with the incoming bank address bits and new fuse information is then written into the TAG memory device 200 using the other port.

The column and row redundancy information is originally recorded in the fuse bank which may reside within or outside the eDRAM macro system 100. The information indicates the failed column and row address bits which were determined during a test mode of the eDRAM macro system 100. It is contemplated that the failed column and row address bits determined during the test mode can be stored in the TAG memory device 200 or in another memory device, such as an SRAM fuse data storage memory device 300 described below.

In the exemplary illustration, eight redundancy wordlines are prepared for repairing 1024 wordlines of a field size of a 1 Mb block (or eight banks). In order to identify a failed row element, 11 bits are necessary, i.e., ten bits to select one of 1024 rows, plus one bit for a master fuse bit. Therefore, for eight redundancy row elements, 88 (11 times 8) fuse bits are needed. Since the repair field for row elements is 1 Mb, all continuous eight banks BNKS of the eDRAM macro system 100 are stored with the same 88 fuse bits of row information. However, if the repair field is reduced to one bank BNK, then each bank BNK will have its own row redundancy information.

Figure 3:
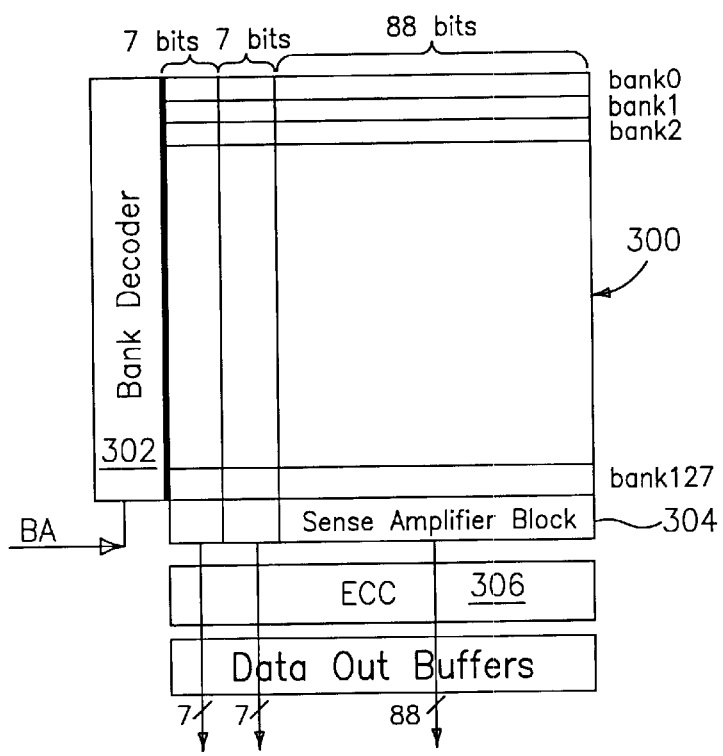
FIG. 3 is a block diagram of an exemplary SRAM fuse data storage device and adjacent devices of the integrated redundancy eDRAM architecture system according to the present invention.

Similarly, for each bank BNK, two groups of four redundancy bit elements are prepared for repairing 36 groups of four bitlines. Hence, for two groups of redundancy bit elements, each group would require seven fuse bits to decode the failed bitline group, i.e., one master fuse bit and six column bits to select one of 36 groups of four bitlines. Therefore, in the exemplary SRAM fuse data storage device designated by reference numeral 300 in FIG. 3, a bank decoder 302 is used to receive an eight-bit bank address and select one of the 128 banks BNKS of the eDRAM macro system 100. Then all the column and row fuse information bits are retrieved by reading out the row data via a sense amplifier block 304.

The SRAM fuse data storage device 300 is filled during a power-on period of the eDRAM macro system 100. After the power-on period, the reliability of the fuse redundancy information stored in the SRAM fuse data storage device 300 must be guaranteed. It is a concern that due to a possibility of soft errors caused by an alpha particle hit, data that are stored in the SRAM fuse data storage device 300 could be lost. To continuously guarantee the integrity of the data, an ECC 306, or error correction code circuit block, can be inserted to periodically check and recycle, or refresh, the data that are stored in the SRAM fuse data storage device 300. This SRAM refresh operation can easily be scheduled by an on-chip scheduler, so there is no penalty to the overall performance of the eDRAM macro system 100.

The fuse information is only retrieved from the SRAM fuse data storage device 300 during an eDRAM read operation. Therefore, a single port SRAM is sufficient for the SRAM fuse data storage device 300. In other words, only the read bank address will be used to access the SRAM fuse data storage device 300 for column and row fuse information. If the row fuse field is defined to be 1 Mb, then 88 row fuse bits are repeatedly stored in eight continuous banks. One can also use a simple circuit to periodically compare the identical row fuse information to perform in-situ error detection and correction operations. Accordingly, it can be assumed that the probability of 14 column redundancy information bits (seven bits for each group of four bitlines as indicated above) in the SRAM array to be hit by the alpha particle is almost zero.

Figure 4A:
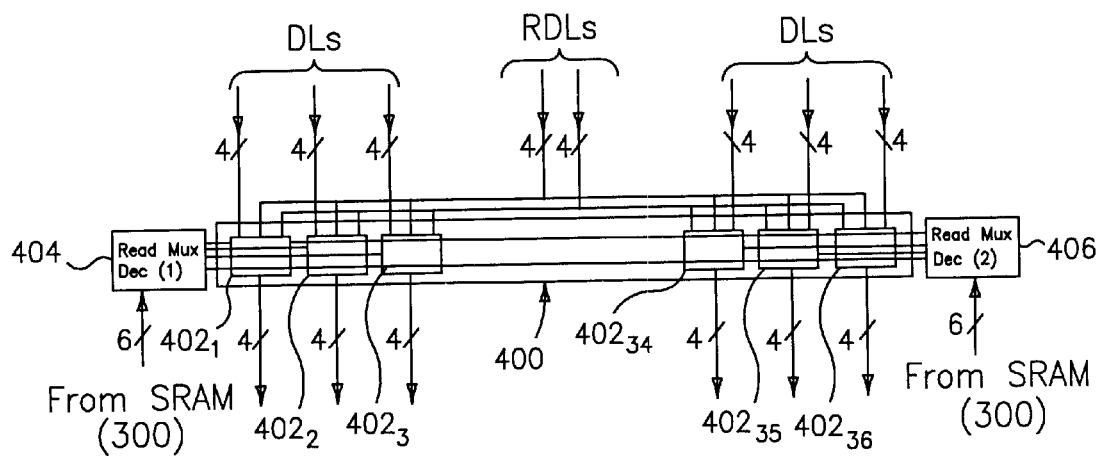
FIG. 4A is a block diagram of a read data steering circuit of a data steering circuit of the integrated redundancy eDRAM architecture system according to the present invention.

With reference to FIG. 4A there is shown a block diagram of a read data steering circuit of a data steering circuit of the integrated redundancy eDRAM architecture system according to the present invention. The read data steering circuit is designated generally by reference numeral 400 and steers any of the two groups of column redundant elements to replace any two of the 36 groups of column elements.

To accomplish this task, 36 switches or multiplexers $402_{1-36}$ and two decoders 404, 406 for receiving data from the SRAM fuse data storage device 300 are provided. Each switch 402 selects one of three groups, i.e., the one column group of incoming datalines DLs corresponding to each respective switch 402 or one of the two redundancy column groups of incoming datalines RDLs, according to the inputs received from the two decoders 404, 406. For example, the first and the second switches $402_1$, $402_2$ each select at most one of the 36 groups of four incoming datalines DLs to be replaced by the redundancy column group of datalines RDLs depending on the incoming six bits of column fuse information supplied by the SRAM fuse data storage device 300 via the two decoders 404, 406. Within each switch 402, either the first or the second redundancy column group of incoming datalines RDLs is selected. The fuse information is determined during the test mode of the eDRAM macro system 100 as indicated above.

Figure 4B:
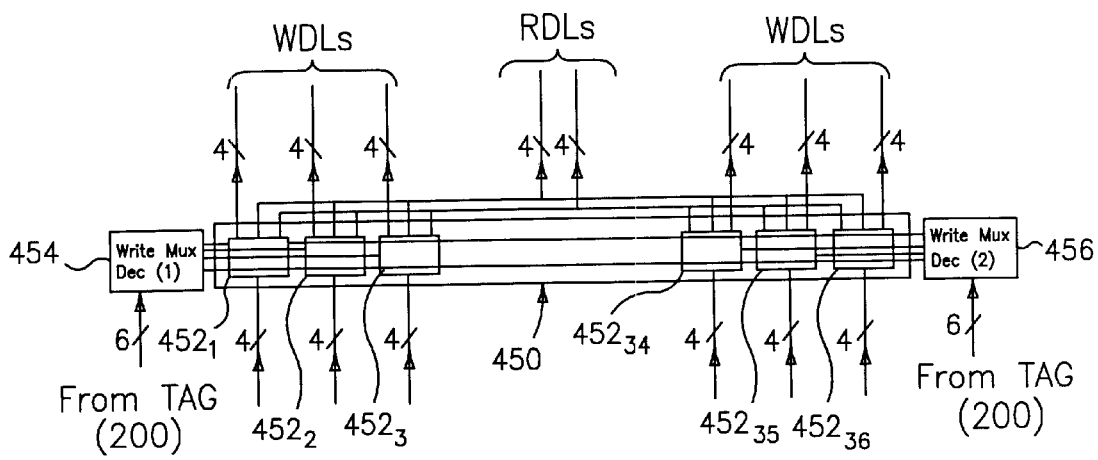
FIG. 4B is a block diagram of a write data steering circuit of the data steering circuit of the integrated redundancy eDRAM architecture system according to the present invention.

With reference to FIG. 4B there is shown a block diagram of a write data steering circuit of the data steering circuit of the integrated redundancy eDRAM architecture system according to the present invention. The write data steering circuit is designated generally by reference numeral 450 and conducts dataline steering during a write operation on the write datalines WDLS. The write data steering circuit 450 operates similarly to the read data steering circuit 400, except that data flow direction is opposite. Also, the column fuse information is supplied to 36 switches or multiplexers $452_{1-36}$ by the TAG memory device 200 via decoders 454, 456.

An embodiment of the integrated eDRAM redundancy architecture system of the present invention having all the components described above is illustrated by FIG. 5 and designated generally by reference numeral 500. The system 500 includes the eDRAM macro 100 having a plurality of eDRAM arrays (banks with decoders), a column steering circuit block 502 having the read and write data steering circuits 400, 450, the four column redundancy decoders 404, 406, 454, 456, the dual-port TAG memory device 200, the single-port SRAM fuse data storage device 300, a row redundancy address comparator 509, and the bank address comparator circuit 510.

The SRAM cache (not shown) provides/retrieves data to/from via two data I/O interface buffer registers 511, 512. The incoming data, row and bank addresses, and commands are latched in the first interface buffer register 512. The outgoing data, row and bank addresses, and commands are latched in the second interface buffer register 511. Accordingly, two different banks of the eDRAM macro 100 are expected to receive one "read" and one "write" command for dual execution. The SRAM cache receives commands from processor(s) and schedules read and write operations, such that the eDRAM macro 100 behaves like a pure SRAM. The scheduled read and write operations arrange a read and a write operation to different banks of the eDRAM macro 100 within each cycle.

In the embodiment shown by FIG. 5, the eDRAM macro 100 includes 256 banks BNKs, where each bank BNK has 144 incoming (or write) and 144 outgoing (or read) datalines. There are two groups of eight redundancy datalines RDLs; one group of read redundancy datalines, i.e., RRDLs, prepared to fix the defective read datalines DLs and one group of write redundancy datalines, i.e., WRDLs, prepared to fix the defective write datalines WDLs. The RDLs are connected to sense amplifiers of the eDRAM macro 100. Each bank BNK of the eDRAM macro 100 receiving row and bank addresses can be independently accessed via its own row decoders, such as row decoders 514, 516.

In order to distinguish the read and write operations, the read row address is labeled as RRA and the write row address is labeled as WRA. Ten bits are needed to decode 1024 wordlines for a bank BNK. Hence, in the embodiment shown by FIG. 5, there are eight bits of read bank address RBA and eight bits of write bank address WBA which are issued to select two of 256 banks BNKs.

Write Operation

The addresses WRA and WBA are issued from the buffer register 512 together with the incoming data from the SRAM cache to the eDRAM macro 100 for performing the write operation. The incoming data from the SRAM cache are data which must be retired to a bank BNK of the eDRAM macro 100. Therefore, the incoming data, such as bank addresses, fuse information (row and column), etc., are always stored in the TAG memory device 200.

The steps for performing an eDRAM macro write operation are as follows:

(1) WRA bits are used to decode the TAG memory device 200 to obtain the data to be retired.

(2) The WBA bits from the TAG memory device 200 are used to select the bank BNK of the eDRAM macro 100 for retiring the data.

(3) Two sets of column fuse information from the TAG memory device 200 are used to decode the two write multiplexer decoders 454, 456 to steer incoming data to the correct datalines.

(4) Four bits of encoded row redundancy information, e.g., three bits of WRRA and one bit of WXADD, are retrieved from the TAG memory device 200 and combined with the WRA bits to select the correct row address of the selected bank BNK to write the incoming data using the row decoder 516. If WXADD equals a logic one, then the WRA bits are ignored, the WRRA bits, or the write redundancy row address bits, are used to select one of the eight row redundancy elements, and the selected row redundancy element is used to replace the currently selected row. If WXADD equal a logic zero, then row redundancy is not performed, and the WRA bits, or the write row address bits, are used to select one of 1024 rows.

Read Operation

The addresses RRA and RBA are issued from the buffer register 511 to the eDRAM macro 100 for performing the read operation. These address bits are used to access the eDRAM macro 100 and are also stored in the TAG memory device 200 for future usage.

The steps for performing an eDRAM macro read operation are as follows:

(1) The RBA bits are used to select the read bank and to decode the SRAM fuse data storage device 300 for obtaining the fuse information. The RBA bits are then stored in the TAG memory device 200.

(2) Two sets of column redundancy information bits (seven bits each) from the SRAM fuse data storage device 300 are used to decode the two read multiplexer decoders 404, 406 to steer outgoing data to the correct datalines. That is, one of the decoders 404, 406 is used to select the first (or second) group of column redundancy elements to replace the first (or second) group of the defective datalines. The column and row redundancy information bits are written to the TAG memory device 200 at the corresponding row address of the corresponding field. The corresponding field is a defined domain for repair.

(3) Eight sets of row redundancy information bits (11 bits each) from the SRAM fuse data storage device 300 are compared with the incoming RRA bits via the row redundancy address comparator 509 to check if a row redundant element has been used. If a match is found, the matched ten bits of row fuse information are encoded to three bits RRRA, or the read redundancy row address bits, and one bit RXADD, i.e., a control bit which disables normal row decoding when a row redundant element is selected, to select the redundant row, the incoming RRA bits are ignored, and data are read from the selected redundant row. The encoded read redundancy row address bits, i.e., the three RRRA bits, are then written to the TAG memory device 200 at the corresponding row address of the corresponding field. If a match is not found, data are read from the row requested or indicated by the incoming RRA bits.

The eDRAM macro read and write operations scheduled by the SRAM cache are executed simultaneously within each clock cycle. The address bits, including the incoming address bits, and the redundancy row and column fuse information bits, are properly stored within the TAG memory device 200 for future cycle operation. The integrated redundancy architecture system 500 allows for short cycle on-chip cache operation for sending data in and for retrieving data out from the eDRAM macro 100 without extra delay to the data flow, thereby protecting data flow pattern integrity. Accordingly, the system 500 not only facilitates the eDRAM macro 100 to act like a pure SRAM cache, but also provides a much bigger cache size than a prior art SRAM cache.

What has been described herein is merely illustrative of the application of the principles of the present invention. For example, the systems described above and implemented as the best mode for operating the present invention are for illustration purposes only. As a particular example, for instance, other design configurations may be used for the various devices of the integrated redundancy architecture system for an eDRAM which provide similar operation as the system described above. In other words, other arrangements and methods may be implemented by those skilled in the art without departing from the scope and spirit of this invention.

We claim:

1. An integrated redundancy architecture system for an embedded DRAM (eDRAM) macro having a plurality of memory cell blocks having a plurality of bitlines traversing there through; a plurality of sense amplifiers each coupled to corresponding bitlines of the plurality of bitlines; and a plurality of datalines, including a group of redundancy datalines, coupled to corresponding sense amplifiers of the plurality of sense amplifiers, said integrated redundancy architecture system comprising:

a column steering circuit, having a read data steering circuit and a write data steering circuit, the column steering circuit coupled to the plurality of datalines and configured for receiving redundancy information and for replacing at least one defective dataline of the plurality of datalines with at least one redundancy dataline of the group of redundancy datalines for passing data through the column steering circuit;

a first memory device for providing the redundancy information to the column steering circuit during a read operation; and a second memory device for providing the redundancy information to the column steering circuit during a write operation.

2. The system according to claim 1, further comprising a bank address comparator for comparing an incoming address with an address stored in the second memory device.

3. The system according to claim 1, wherein the first memory device is an SRAM fuse data storage device and the second memory device is a TAG memory device.

4. The system according to claim 1, further comprising an SRAM cache for receiving and transmitting data from and to the column steering circuit.

5. The system according to claim 1, wherein the second memory device stores a fuse valid bit, a plurality of column redundant information bits, a plurality of bank address bits, and at least one encoded row redundant information bit for each of a plurality of rows of the second memory device.

6. The system according to claim 1, wherein data is stored within the first memory device during a power-on period of the system.

7. The system according to claim 1, further comprising an error correction code circuit block connected to the first memory device having means for guaranteeing the integrity of the data stored within the first memory device.

8. The system according to claim 1, wherein the first memory device stores a plurality of redundancy information bits for decoding failed bitline groups of the plurality of bitlines of the eDRAM macro and a plurality of bits for identifying failed row elements of the eDRAM macro.

9. The system according to claim 1, wherein the column steering circuit includes at least one multiplexer and at least one decoder, wherein the at least one decoder receives data from one of the first memory device and the second memory device for selecting between at least one redundancy dataline of the group of redundancy datalines and a non-redundancy dataline of the plurality of datalines for passing data through the column steering circuit.

10. The system according to claim 1, further comprising a row redundancy address comparator for comparing redundancy bits received from the first memory device with bits received from a buffer.

11. The system according to claim 1, wherein the eDRAM macro includes means for simultaneously performing the read and write operations.

12. The system according to claim 11, wherein one bank of the eDRAM macro is used for performing the read operation and another bank of the eDRAM macro is used for performing the write operation.

13. The system according to claim 1, further comprising at least one I/O data interface buffer for transferring data from and to an SRAM cache.

14. The system according to claim 1, further comprising means for simultaneously accessing the first and second memory devices for simultaneously retrieving and providing the redundancy information to the column steering circuit to facilitate simultaneous performance of the read and write operations.

15. The system according to claim 1, wherein the read and write operations are performed during a single clock cycle.

16. The system according to claim 1, wherein the first and second memory devices include means for storing failed row and column address bits corresponding to failed rows and columns within the system.

17. A column steering circuit for an embedded DRAM (eDRAM) system, said eDRAM system having a plurality of memory cell blocks having a plurality of bitlines traversing there through; a plurality of sense amplifiers each coupled to corresponding bitlines of the plurality of bitlines; and a plurality of datalines, including a group of redundancy datalines, coupled to corresponding sense amplifiers of the plurality of sense amplifiers, said column steering circuit comprising:

means for receiving redundancy information from one of a first memory and a second memory; and means for replacing at least one defective dataline of the plurality of datalines with at least one redundancy dataline of the group of redundancy datalines for passing data through the column steering circuit having a read data steering circuit and a write data steering circuit, the column steering circuit.

18. The circuit according to claim 17, wherein the means for receiving redundancy information receives the redundancy information from the first memory for a read operation and receives the redundancy information from the second memory for a write operation.

19. The circuit according to claim 17, wherein the first memory is provided within an SRAM fuse data storage device and the second memory is provided within a TAG memory device.

20. The circuit according to claim 17, further comprising at least one multiplexer and at least one decoder, wherein the at least one decoder receives data from one of the first memory and the second memory for selecting between at least one redundancy dataline of the group of redundancy datalines and a non-redundancy dataline of the plurality of datalines for passing data through the column steering circuit.

21. A method for reading data stored within an eDRAM macro, the method comprising the steps of:

receiving incoming address bits and using the incoming address bits to select a bank of the eDRAM macro and to decode a memory to obtain a first set of redundancy information bits;

using the first set of redundancy information bits to decode at least one decoder to steer outgoing data from the eDRAM macro to non-defective datalines;

retrieving a second set of redundancy information bits from the memory;

comparing the second set of redundancy information bits with the incoming address bits;

if the second set of redundancy information bits and the incoming address bits are identical, then:
  encoding the second set of redundancy information bits to at least a set of read redundancy row address bits to select a redundant row from the eDRAM macro; and
  reading data from the selected redundant row element; and if the second set of redundancy information bits and the incoming address bits are not identical, then:
  reading data from a row of the eDRAM macro as indicated by the incoming address bits.

22. The method according to claim 21, further comprising the step of storing the incoming address bits, the first set of redundancy information bits, and the set of read redundancy row address bits in at least one memory.

23. A method for writing data to an eDRAM macro, the method comprising the steps of:

receiving incoming address bits and using the incoming address bits to decode a memory to obtain data to be written to the eDRAM macro;

selecting a bank of the eDRAM macro using a set of the incoming address bits for writing the data thereto;

retrieving a first set of redundancy information bits from the memory to decode at least one decoder to steer incoming data to the eDRAM macro via non-defective datalines;

retrieving a second set of redundancy information bits from the memory;

combining the second set of redundancy information bits with the incoming address bits for selecting a row address of the selected bank for writing the data thereto;

determining whether to perform row redundancy to replace a row corresponding to the selected row address with a row redundancy element; and writing the data to a row element corresponding to the selected row address.

24. The method according to claim 23, wherein the step of determining comprises the steps of:

determining a logic state of at least one bit of the second set of redundancy information bits;

if the logic state of the at least one bit is a logic high state, then:

selecting the row redundancy element using a subset of the second set of redundancy information bits; and replacing the row corresponding to the selected row address with the row redundancy element which is selected using the subset of the second set of redundancy information bits; and if the logic state of the at least one bit is a logic low state, then:

using the incoming address bits to select the row corresponding to the selected row address.

* * * * *